(12) United States Patent
Kinoshita et al.

(10) Patent No.: US 7,368,767 B2
(45) Date of Patent: May 6, 2008

(54) SEMICONDUCTOR INTEGRATED CIRCUIT DEVICE FORMED BY AUTOMATIC LAYOUT WIRING BY USE OF STANDARD CELLS AND DESIGN METHOD OF FIXING ITS WELL POTENTIAL

(75) Inventors: Koichi Kinoshita, Yokohama (JP); Yasuhito Itaka, Yokohama (JP); Takeshi Sugahara, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 149 days.

(21) Appl. No.: 11/087,597

(22) Filed: Mar. 24, 2005

(65) Prior Publication Data
US 2006/0131609 A1    Jun. 22, 2006

(30) Foreign Application Priority Data
Mar. 24, 2004    (JP)    ............... 2004-086301

(51) Int. Cl.
*H01L 27/10*    (2006.01)
(52) U.S. Cl. .................. 257/202; 257/202; 257/204; 257/206; 257/207; 257/210; 257/909; 438/128; 438/587; 438/598

(58) Field of Classification Search .............. 716/8, 716/12; 257/202, 207, 211; 761/1
See application file for complete search history.

(56) References Cited

U.S. PATENT DOCUMENTS 5,764,533 A  *  6/1998  deDood ............... 716/8

FOREIGN PATENT DOCUMENTS

| JP | 2000-332118 | 11/2000 |
|---|---|---|
| JP | 2003-133416 | 5/2003 |

* cited by examiner

*Primary Examiner*—Zandra V. Smith
*Assistant Examiner*—Tsz Kit Chiu
(74) *Attorney, Agent, or Firm*—Oblon, Spivak, McClelland, Maier & Neustadt, P.C.

(57) ABSTRACT

A standard cell is read from a library and automatic layout wiring is performed, thereby configuring a circuit. Next, each cell column in the configured circuit is searched for an empty region. In the empty region in the cell column searched for, a spacer cell or a filler cell is placed. At this time, using the spacer cell or filler cell, the well potential of the standard cells in the cell column is fixed.

14 Claims, 6 Drawing Sheets

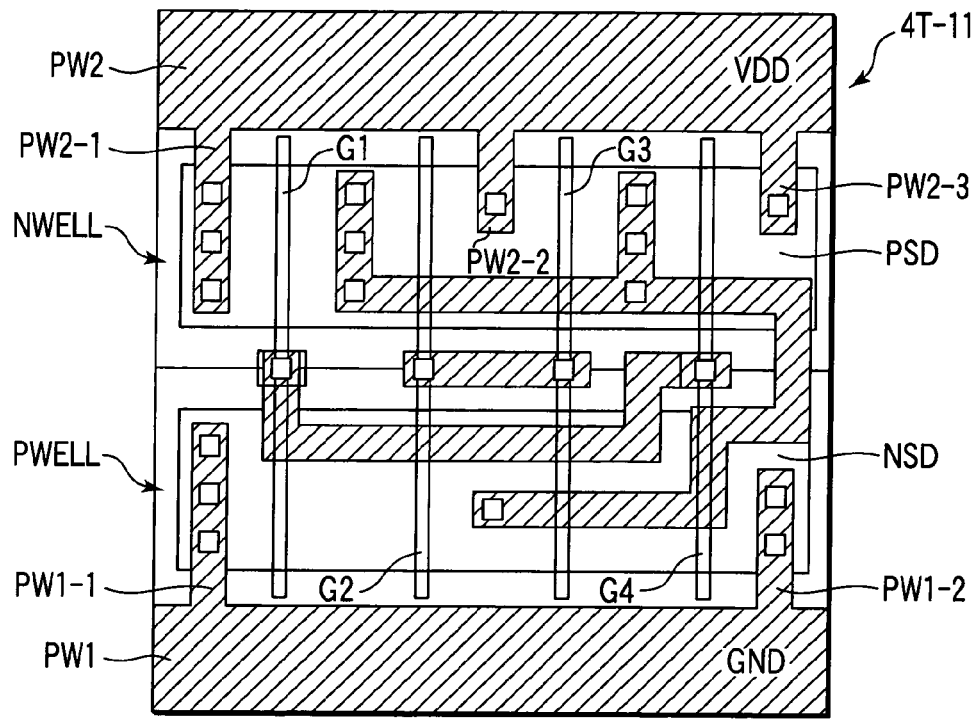
F I G. 2
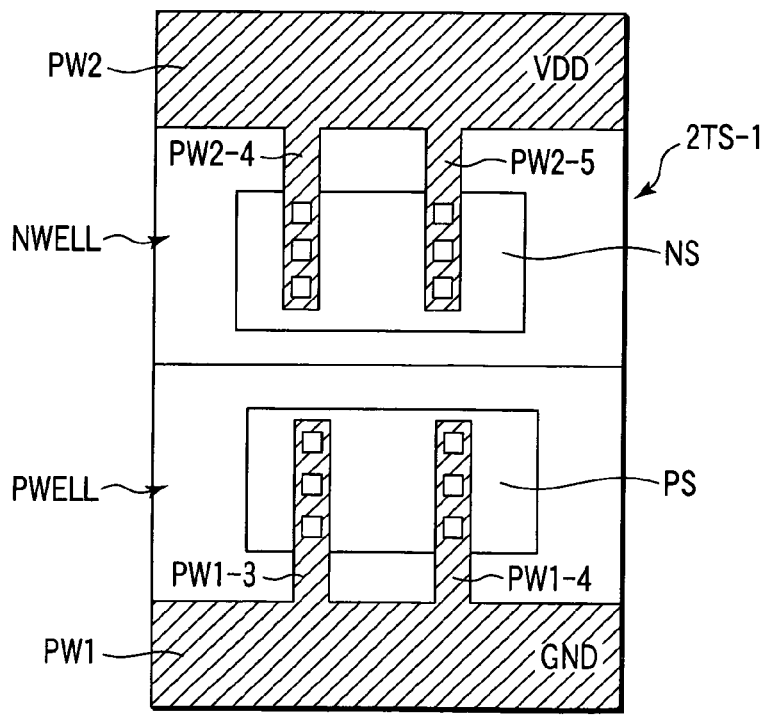
F I G. 3

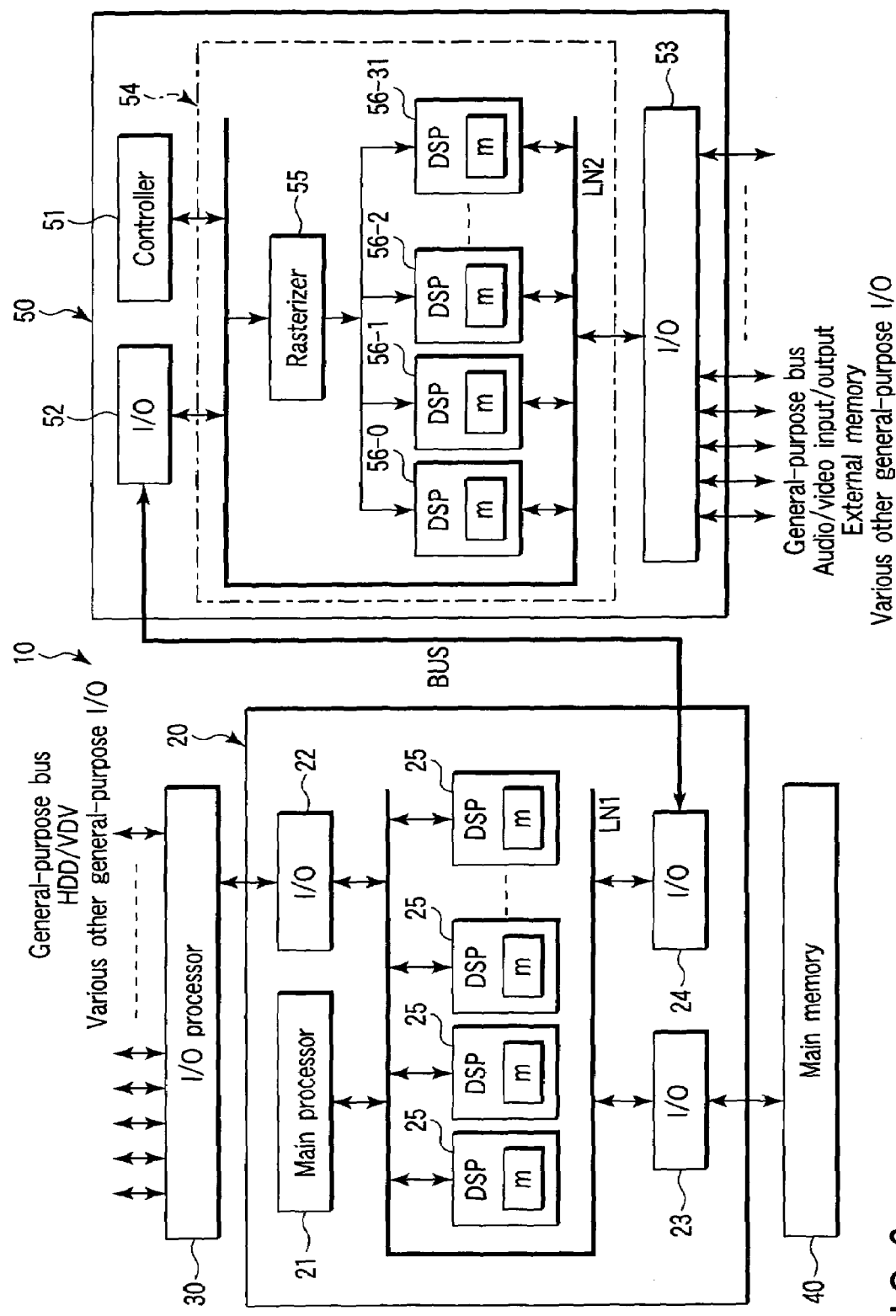
F I G. 6

SEMICONDUCTOR INTEGRATED CIRCUIT DEVICE FORMED BY AUTOMATIC LAYOUT WIRING BY USE OF STANDARD CELLS AND DESIGN METHOD OF FIXING ITS WELL POTENTIAL

CROSS-REFERENCE TO RELATED APPLICATIONS

This application is based upon and claims the benefit of priority from prior Japanese Patent Application No. 2004-366438, filed Dec. 17, 2004, the entire contents of which are incorporated herein by reference.

BACKGROUND OF THE INVENTION

1. Field of the Invention

This invention relates to a semiconductor integrated circuit device and its design method, and more particularly to the technique for fixing the well potential in a semiconductor integrated circuit device formed by automatic layout wiring by use of standard cells.

2. Description of the Related Art

It is known that the element characteristics of the transistors formed in a semiconductor integrated circuit device, such as an IC or an LSI, are influenced by fluctuations in the well potential. To avoid such influence and stabilize the element characteristics of the transistors, it is necessary to stabilize (fix) the well potential.

In a semiconductor integrated circuit device formed by automatic layout wiring by use of standard cells, each of the standard cells is provided with a power supply voltage terminal and a ground potential terminal. To fix the well potential, active regions called a P-sub region and an N-sub region are formed in the p-well region and n-well region, respectively. The p-well region is connected via the P-sub region to the ground potential terminal, thereby fixing the p-well region to the ground potential GND. The n-well region is connected via the N-sub region to the power supply voltage terminal, thereby fixing the n-well region to a power supply voltage VDD.

In standard cells, an interconnection for the power supply voltage VDD and an interconnection for the ground potential GND are provided to two sides facing each other in the direction in which the cells are arranged. In the semiconductor substrate under these interconnections, the p-well region and the n-well region are formed. In these well regions, semiconductor elements, including transistors, are formed so as to configure various circuits. In the p-well region and n-well region, the well potential fixing P-sub region and N-sub region are formed. The interconnection for the power supply voltage is electrically connected via a contact hole to the N-sub region and the interconnection for the ground potential is electrically connected via a contact hole to the P-sub region, thereby fixing the well potential.

To make use of the substrate bias effect of a MOS transistor positively, a standard cell may be used which has four terminals for the power supply voltage, ground potential, P-sub region, and N-sub regions (for example, referred to in Jpn. Pat. Appln. KOKAI Publication No. 2000-332118). The 4-terminal standard cell applies via independent lines the power supply voltage VDD, the ground potential GND, the potential VBN for fixing the n-well potential, and the potential VBP for fixing the p-well potential. In the 4-terminal standard cell, a line for applying the potential VBP for fixing the p-well potential and a line for applying the potential VBN for fixing the n-well potential are provided to two sides facing in the direction in which the cells are arranged. In the semiconductor substrate under these lines, the N-sub region and P-sub region are formed. The line for fixing the potential in the p-well region is electrically connected via a contact hole to the P-sub region and the line for fixing the potential in the n-well region is electrically connected via a contact hole to the N-sub region. Inside the lines, an interconnection for the power supply voltage VDD and an interconnection for the ground potential GND are arranged. The n-well region and p-well region are formed in the semiconductor substrate between the interconnections. In the n-well region and p-well region, semiconductor elements, including transistors, are formed so as to configure various circuits.

With the above configuration, however, the P-sub region and N-sub region for fixing the well potential and their interconnections lead to an increase in the cell area. To prevent the cell area from increasing, the sizes of semiconductor elements, including transistors, formed in the cell have to be reduced, resulting in a decrease in the driving capability. Particularly when the sub-regions and their interconnections are formed with the minimum line width according to design rules, the minimum distance or the like for the MOS transistors formed in the well region is limited or the step coating property is degraded. From these points of view, the cell area increases or the sizes of transistors must be reduced. In addition, contact with the densely arranged sub-regions necessitates complicated manufacturing processes. If there are a lot of such patterns, this results in a drop in the manufacturing yield.

With the miniaturization of semiconductor integrated circuit devices, the power supply voltage is getting lower and therefore the substrate current is getting smaller. Therefore, in a semiconductor integrated circuit device with a lowered power supply voltage, there is a possibility that the well potential can be fixed efficiently by minimizing a decrease in the driving capability due to an increase in the cell area or a reduction in the transistor size. This is because, when the power supply voltage comes close to 1V, a much potential difference needed for a forward current to flow through the p-n junction does not appear. Since not only the substrate current decreases due to the lowered power supply voltage, but also the source potential of the transistor is normally fixed, when the power supply voltage is about 1V, a fluctuation in the well potential caused by the coupling with the drain is less than 0.5V, half the power supply voltage. Therefore, there is almost no possibility that a breakdown will take place due to latch-up.

Naturally, when the substrate potential fluctuates at random, the driving capability of the transistor and the leakage current fluctuate according to the fluctuation of the potential. Therefore, to take measures against the fluctuations, the well potential has to be fixed.

BRIEF SUMMARY OF THE INVENTION

According to an aspect of the present invention, there is provided a semiconductor integrated circuit device comprising a circuit section which is formed by arranging cell columns, each having standard cells arranged in a first direction, in a second direction crossing the first direction, the cell columns including, first standard cells each of which has a first and a second terminal to which a power supply voltage and the ground potential are applied, a third and a fourth terminal to which a well potential fixing potential is applied, and a transistor circuit to which the first and second terminals supply power and the third and fourth terminals apply a back gate bias, and second standard cells which fill up empty regions in the cell columns and apply the well potential fixing potential to the third and fourth terminals of the first standard cells.

According to another aspect of the present invention, there is provided a method of designing a semiconductor integrated circuit device comprising reading a standard cell from a library and forming a circuit by automatic layout wiring, searching each cell column in the formed circuit for an empty region, and placing a spacer cell or a filler cell in the empty region in the cell column searched for and fixing the well potential of the standard cells in the cell column by using the spacer cell or filler cell.

According to further aspect of the present invention, there is provided a method of designing a semiconductor integrated circuit device comprising reading a 4-terminal standard cell from a library and forming a temporary circuit by automatic layout wiring, measuring the operation timing of the formed temporary circuit, judging the measured operation timing, calculating the optimum value for timing adjustment on the basis of the judged operation timing, reading a 2-terminal standard cell from the library on the basis of the calculated optimum value for timing adjustment and making a timing adjustment by selectively replacing 4-terminal standard cells arranged in a plurality of cell columns with 2-terminal standard cells, forming a circuit by reperforming automatic layout wiring, searching each cell column in the formed circuit for an empty region, and placing a spacer cell or a filler cell in the empty region in the cell column searched for, the well potential of the 4-terminal standard cells arranged in the cell columns being fixed by using the 2-terminal standard cells and the spacer cell or filler cell.

BRIEF DESCRIPTION OF THE SEVERAL VIEWS OF THE DRAWING

FIG. 2 is a plan view of a pattern of a 4-terminal standard cell used in the semiconductor integrated circuit device of FIG. 1;

FIG. 3 is a plan view of a pattern of a spacer cell or a filler cell used in the semiconductor integrated circuit device of FIG. 1;

FIG. 6 is a block diagram of an image drawing processor system LSI to help explain an application of a semiconductor integrated circuit device and its design method according to the first and second embodiments.

DETAILED DESCRIPTION OF THE INVENTION

First Embodiment

Figure 1:
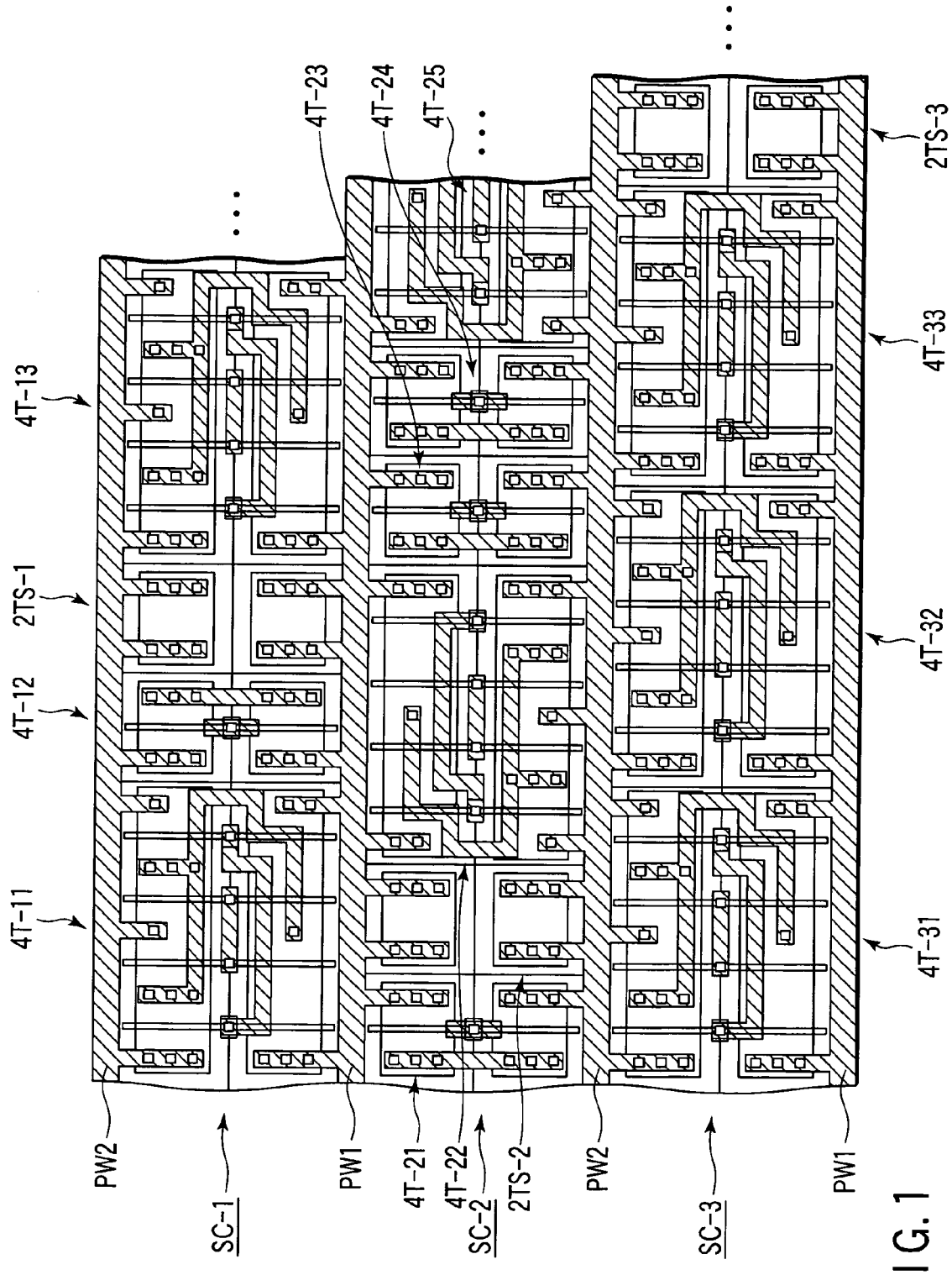
FIG. 1 is a plan view showing a pattern configuration to help explain a semiconductor integrated circuit device according to a first embodiment of the present invention.

FIG. 1 is a plan view showing a pattern configuration to help explain a semiconductor integrated circuit device according to a first embodiment of the present invention.

FIG. 1 shows a layout image example by extracting a part of the circuit pattern in a semiconductor integrated circuit device formed by automatic layout wiring by use of standard cells.

In a layout example of FIG. 1, three stages of cell columns SC-1, SC-2, SC-3 are arranged. The adjacent cell columns SC-1, SC-2 share an interconnection (power supply line) PW1. The adjacent cell columns SC-2, SC-3 share an interconnection (power supply line) PW2. The power supply line PW2 is for, for example, the power supply voltage VDD. The power supply line PW1 is for, for example, the ground potential GND. Each of the power supply lines PW1, PW2 includes a branch section extending into the cell so as to face the corresponding branch section of the other. These branch sections are connected via contact holes to the semiconductor elements formed in each of the cells, such as the sources or drains of the MOS transistors.

In the first-stage cell column SC-1, 4-terminal cells 4T-11, 4T-12, 4T-13 and a 2-terminal spacer cell (of filler cell) 2TS-1 are arranged. The spacer cell 2TS-1 is provided in an empty region between cells, specifically between cell 4T-12 and cell 4T-13. The spacer cell 2TS-1 connects the p-well regions and n-well regions of cell 4T-11, cell 4T-12, and cell 4T-13 in the cell column SC-1 to one another. The p-well region and n-well region of the spacer cell 2TS-1 are fixed to the ground potential GND and power supply voltage VDD via the P-sub region and N-sub region (active regions). As a result, the spacer cell 2TS-1 supplies a well potential fixing bias voltage to the p-well regions and n-well regions of cell 4T-11, cell 4T-12, and cell 4T-13 which have neither a P-sub region nor an N-sub region, thereby fixing these p-well regions and n-well regions to the ground potential GND and power supply voltage VDD.

In the second-stage cell column SC-2, 4-terminal cells 4T-21, 4T-22, 4T-23, 4T-24, 4T-25 and a 2-terminal spacer cell 2TS-2 are arranged. The spacer cell 2TS-2 is provided in an empty region between cell 4T-21 and cell 4T-22. The spacer cell 2TS-2 connects the p-well regions and n-well regions of cell 4T-21, cell 4T-22, cell 4T-23, cell 4T-24, and 4T-25 in the cell column Sc-2 to one another. The spacer cell 2TS-2 supplies a potential fixing bias voltage to the p-well regions and n-well regions of 4-terminal cells 4T-21, 4T-22, 4T-23, 4T-24, and 4T-25.

In the third-stage cell column SC-3, 4-terminal cells 4T-31, 4T-32, 4T-33 and a 2-terminal spacer cell 2TS-3 are arranged. The spacer cell 2TS-3 is provided in an empty region adjacent to cell 4T-33. The spacer cell 2TS-3 connects the p-well regions and n-well regions of cell 4T-31, cell 4T-32, and cell 4T-33 in the cell column SC-3 in the cell column SC-3 to one another. The spacer cell 2TS-3 provided in the empty region between cells supplies a potential fixing bias voltage to the p-well regions and n-well regions of 4-terminal cells 4T-31, 4T-32, and 4T-33.

Each of the 4-terminal standard cells 4T-11 to 4T-13, 4T-21 to 4T-25, 4T-31 to 4T-33 has a first terminal for power supply voltage VDD, a second terminal for ground (0V) GND, a third terminal for fixing the potential of the n-well region, and a fourth terminal for fixing the potential of the p-well region. The source or drain of each MOS transistor formed in the cell is selectively connected to the first and second terminals and its back gate is selectively connected to the third and fourth terminals. The 4-terminal standard cells are used to make use of the substrate bias effect of the MOS transistor.

On the other hand, in a case where logic cells (or standard cells) are arranged by automatic layout wiring, when an empty region develops because of interconnection, the spacer cells (or filler cells) 2TS-1, 2TS-2, 2TS-3 are embedded in the space. Each of the spacer cells has a first terminal for power supply voltage VDD and a second terminal for ground potential (0V) GND. The spacer cells are provided in the empty regions in the cell columns SC-1, SC-2, SC-3 at random.

FIG. 2 is a plan view of a pattern of a 4-terminal standard cell used in the semiconductor integrated circuit device of FIG. 1. A CMOS NAND gate 4T-11 is used as an example. In the standard cell 4T-11, the power supply line (metal layer) PW2 for power supply voltage VDD and the power supply line (metal layer) PW1 for ground potential GND are provided at the upper side and lower side of the cell in the direction in which the cell column SC-1 extends. In the semiconductor substrate under the power supply line PW2, an n-well region NWELL is formed, whereas in the semiconductor substrate under the power supply line PW1, a p-well region PWELL is formed. In the n-well region NWELL, the source-drain region PSD of a p-channel MOS transistor is formed. In the p-well region PWELL, the source-drain region NSD of an n-channel MOS transistor is formed.

The power supply lines PW2, PW1 have branch sections PW2-1, PW2-2, PW2-3, PW1-1, PW1-2 extending into the cell so as to face the corresponding branch section. These branch sections PW2-1, PW2-2, PW2-3, PW1-1, PW1-2 are connected to the semiconductor elements formed in each of the cells, such as the sources or drains of the MOS transistors, via contact holes. The gates G1 to G4 of these MOS transistors are arranged in the same direction as the branch section.

The well regions PWELL, NWELL of the 4-terminal standard cell have neither a P-sub region nor an N-sub region and are not connected to the well potential fixing line. That is, they are connected to neither the power supply voltage VDD nor the ground potential GND in the cell. In the 4-terminal standard cell, since the well regions NWELL, PWELL themselves are used for connection with the well regions of adjacent cells, there is no need to provide an N-sub region at the boundary between cell columns. In addition, neither lines for applying the well potential fixing potential nor contact holes are needed in the N-sub region. As a result, the pattern occupied area is smaller than that in a normal 4-terminal standard cell.

FIG. 3 is a plan view of a pattern of a spacer cell (or filler cell) 2TS-1 used in the semiconductor integrated circuit device of FIG. 1. As shown in FIG. 3, in the spacer cell 2TS-1, the power supply line (metal layer) PW2 for power supply voltage VDD and the power supply line (metal layer) PW1 for ground potential GND are provided at the upper side and lower side of the cell in the direction in which the cell column SC-1 extends. In the semiconductor substrate expanding from under the power supply line PW2 into the cell, an n-well region NWELL is formed, whereas in the semiconductor substrate expanding from under the power supply line PW1 into the cell, a p-well region PWELL is formed. In the well regions NWELL, PWELL, an N-sub region and P-sub regions are provided.

The power supply lines PW2, PW1 have branch sections PW2-4, PW2-5, PW1-3, PW1-4 extending into the cell so as to face the corresponding branch sections. These branch sections PW2-4, PW2-5, PW1-3, PW1-4 are connected to the N-sub region NS and P-sub region PS via contact holes.

Specifically, in the spacer cell 2TS-1, the power supply line PW2 is connected to the n-well region NWELL via the N-sub region NS and the power supply line PW1 is connected to the p-well region PWELL via the P-sub region PS.

The power supply line PW2 of the spacer cell 2TS-1 is connected equally to the power supply lines PW2 of the adjacent standard cells 4T-12, 4T-13. The power supply line PW1 of the spacer cell 2TS-1 is connected equally to the power supply lines PW1 of the adjacent standard cells 4T-12, 4T-13. In addition, the n-well region NWELL of the spacer cell 2TS-1 is connected equally to the n-well regions of the standard cells 4T-12, 4T-13. The p-well region PWELL of the spacer cell 2TS-1 is connected equally to the p-well regions of the adjacent standard cells 4T-12, 4T-13. The spacer cell 2TS-1 supplies a well potential fixing bias voltage to the adjacent standard cells 4T-12, 4T-13 (also to 4T-11).

As described above, in the first embodiment, the term spacer cells or filler cells have been used for the sake of convenience. They differ from ordinary spacer cells or filler cells in that they have the function of applying the well potential fixing bias voltage to a 4-terminal standard cell.

Although the spacer cell or filler cell shown in FIG. 3 is not provided with a semiconductor element, such as a MOS transistor, it may be provided with a semiconductor element, such as a dummy MOS transistor, not constituting a logic circuit.

Figure 4:
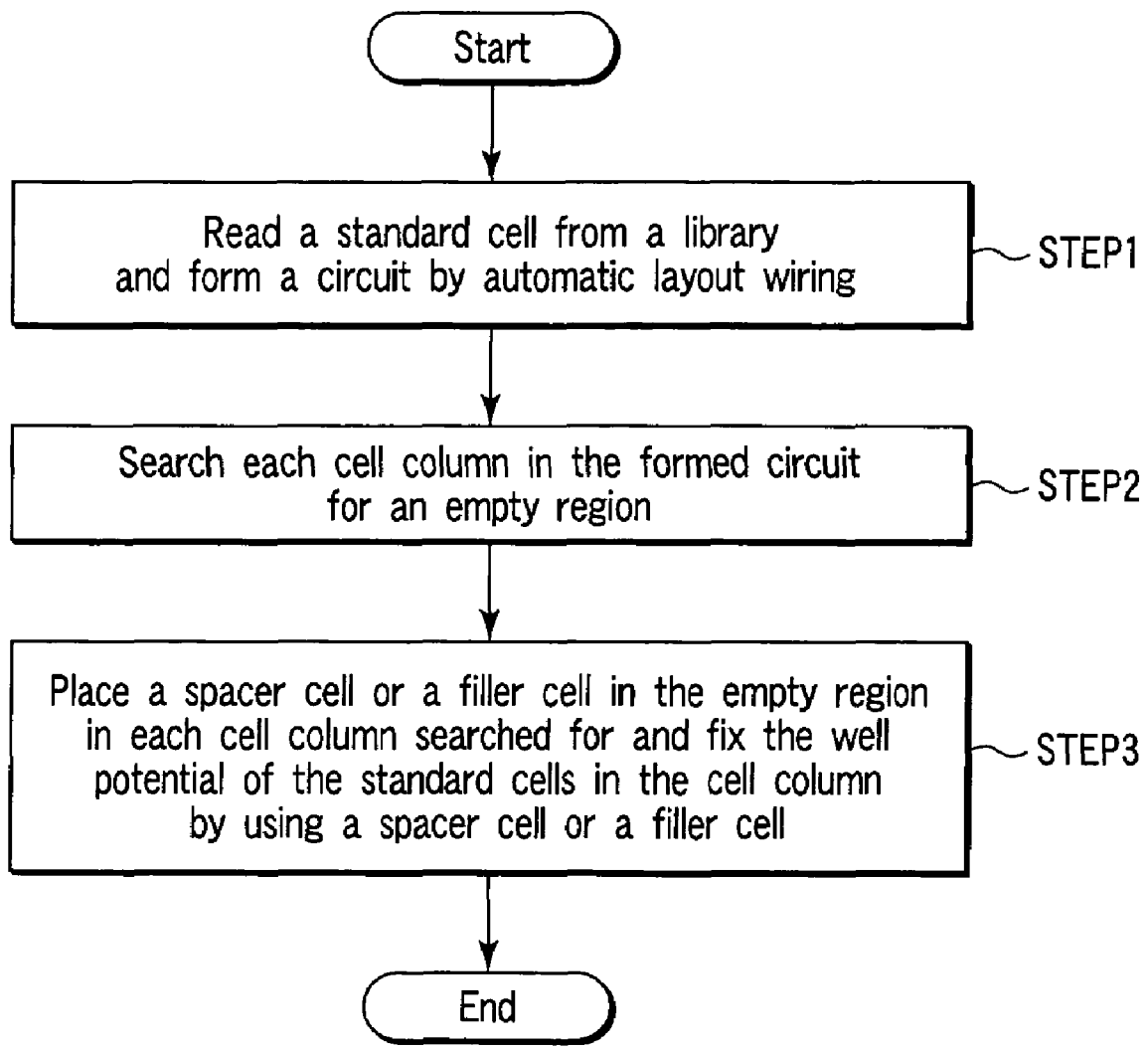
FIG. 4 is a flowchart to help explain a design method of forming the semiconductor integrated circuit device of FIG. 1.

FIG. 4 is a flowchart to help explain a design method of forming the semiconductor integrated circuit device of FIG. 1.

First, a 4-terminal standard cell is read from a library and a circuit is formed by automatic layout wiring (STEP 1).

Next, each of the cell columns in the formed circuit is searched for an empty region (STEP 2).

Then, a spacer or a filler is provided in the empty region in each of the column cells searched for (STEP 3). In STEP 3, the well potential of the 2-terminal standard cell in the cell column is fixed using the spacer cell or filler cell.

With the semiconductor integrated circuit device configured as described above and its design method, the well potential fixing bias voltage can be applied from the spacer or filler provided in the empty region without forming P-sub regions and N-sub regions in the main standard cells constituting the circuit, the interconnections for applying well potential fixing potentials to these regions, contacts, and others. As described above, there is almost no possibility that a breakdown will take place due to latch-up in the semiconductor integrated circuit device with the lowered power supply voltage. The substrate potential has only to be prevented from fluctuating at random, which enables the spacer cell or filler cell provided in the empty region to fix the potential in the well region sufficiently.

Therefore, the fluctuation of the substrate potential can be suppressed. The spacer cells or filler cells are provided so as to be embedded in empty regions formed at random in the cell columns and allow a P-sub region and an N-sub region to be provided in the inside of a cell, not at the boundary between cell columns, which prevents an increase in the pattern occupied area. In addition, there is no need to provide an N-sub region and a P-sub region at the boundary between the adjacent cell columns. Therefore, there is no need to form interconnections for the sub-regions and make contact with them. Accordingly, the width of the cell column can be made narrower and therefore the pattern occupied area can be reduced.

Of course, the sizes of the semiconductor elements formed in a standard cell need not be reduced, which prevents the driving capability from falling.

Therefore, in the semiconductor integrated circuit device with the lowered power supplied voltage, it is possible to fix the well potential effectively, while suppressing an increase in the pattern occupied area and a drop in the driving capability of the semiconductor elements formed inside.

In FIGS. 2 and 3, the explanation has been given using the case where the n-well region and p-well region have been formed in the semiconductor substrate and p-channel MOS transistors, n-channel MOS transistors, N-sub regions, and P-sub regions have been formed in each well region. However, the present invention may be applied to a configuration where an n-well region is formed in a p-type semiconductor substrate, an n-channel MOS transistor and a P-sub region are formed in the semiconductor substrate and a p-channel MOS transistor and an N-sub region are formed in the n-well region.

Second Embodiment

Figure 5:
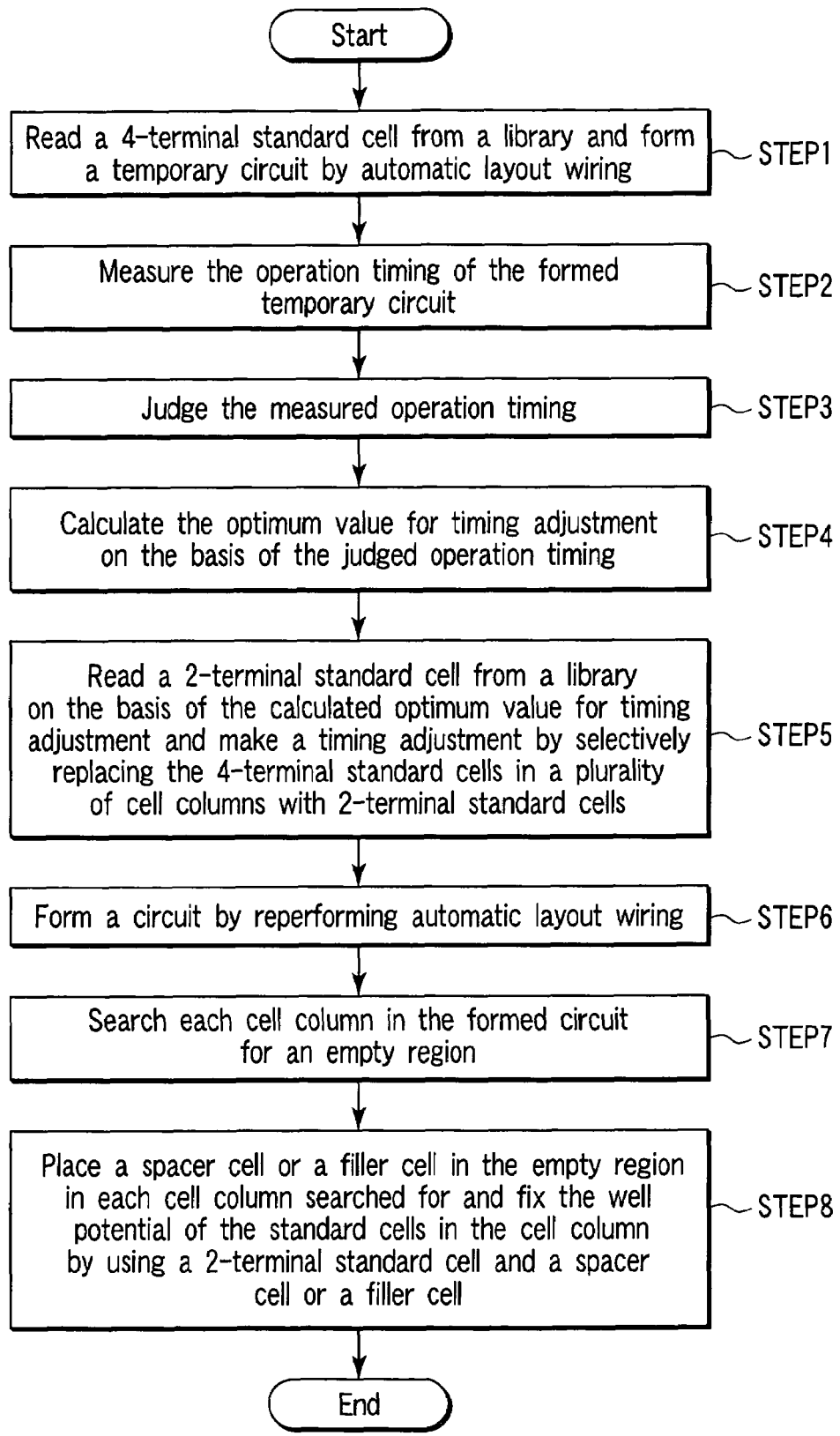
FIG. 5 is a flowchart to help explain a method of designing a semiconductor integrated circuit device according to a second embodiment of the present invention.

FIG. 5 is a flowchart to help explain a method of designing a semiconductor integrated circuit device according to a second embodiment of the present invention. The second embodiment optimizes the operation timing of the circuit by replacing a part of the circuit composed of 4-terminal cells with 2-terminal cells and produces the same effect as the first embodiment.

First, a 4-terminal standard cell is read from a library and a temporary circuit is composed of (temporarily configured using) only 4-terminal standard cells by automatic layout wiring (STEP 1).

Next, the operation timing of the temporary circuit formed is measured (STEP 2).

Thereafter, the measured operation timing is judged (STEP 3).

Next, a timing adjustment optimum value is calculated on the basis of the judged operation timing (STEP 4).

Then, on the basis of the calculated timing adjustment optimum value, a 2-terminal standard cell is read from the library. Timing adjustment is made by selectively replacing the 4-terminal standard cells in a plurality of cell columns with 2-terminal standard cells (STEP 5).

Thereafter, a circuit is formed by reperforming automatic layout wiring (STEP 6).

Next, each of the cell columns in the formed circuit is searched for an empty region (STEP 7).

Then, a spacer cell or a filler cell is placed in an empty region in each of the cell columns. (STEP 8)

In the design method of the second embodiment, 2-terminal standard cells and the spacer cells or filler cells are used to supply a well potential fixing potential to the 4-terminal standard cells in the cell columns.

In a 2-terminal cell, the transistor size may be limited to a smaller value because of the design rules. However, after the operation timing is analyzed as in the second embodiment, 4-terminal cells allowed to operate at low speed are located and then replaced with 2-terminal cells whose MOS transistors are smaller (or equal) in size, which makes it possible to fix the well potential without impairing the chip performance (speed and area).

The above design method not only produces the same effects as those of the first and second embodiments but also can fix the well potential, while optimizing the operation timing of the circuit.

When 2-terminal cells are used as described above, the 2-terminal cells can apply the well potential fixing potential to the 4-terminal cells, but are not always capable of applying a sufficient potential if priority is given to timing adjustment. To avoid this problem, not only the 2-terminal cells but also spacer cells (or filler cells) are used for fixing the well potential, which enables the well potential to be fixed more stably.

Application

Next, a drawing apparatus will be explained as an application of the semiconductor integrated circuit device according to the first and second embodiments and its design method.

FIG. 6 is a block diagram of an image drawing processor system LSI. The image drawing processor system LSI 10 includes a host processor 20, an I/O processor 30, a main memory 40, and a graphic processor 50. The host processor 20 and the graphic processor 50 are connected to each other by a processor bus BUS in such a manner that they can communicated with each other.

The host processor 20 includes a main processor 21, I/O sections 22 to 24, and a plurality of signal processing sections (DSP: Digital Signal Processors) 25. These circuit blocks are connected to one another via a local network LN1 in such a manner that they can communicate with one another. The main processor 21 controls each circuit block in the host processor 20. The I/O section 22 exchanges data with a circuit outside the host processor 20 via the I/O processor 30. The I/O section 23 exchanges data with the main memory 40. The I/O section 24 exchanges data with the graphic processor 50 via the processor bus BUS. The signal processing section 25 processes signals on the basis of the data read from the main memory 40 or from the exterior.

The I/O processor 30 connects the host processor 20 to, for example, a general-purpose bus, peripheral devices, including a HDD and a DVD (Digital Versatile Disk) drive, or a network. At this time, the peripheral device may be mounted on the LSI 10 or outside the LSI 10.

The main memory 40 holds a program necessary for the host processor 20 to operate. The program is read from, for example, an HDD (not shown) or the like and is stored in the main memory 40.

The graphic processor 50 includes a controller 51, I/O sections 52, 53, and a computing section 54. The controller 51 communicates with the host processor 20 and controls the computing section 54. The I/O section 52 supervises the input and output to and from the host processor 20 via the processor bus BUS. The I/O section 53 supervises the input and output to and from various general-purpose buses, including a PCI, video and audio equipment, and an external memory or the like. The computing section 54 performs image processing calculations.

The computing section 54 includes a rasterizer 55 and a plurality of signal processing sections 56-0 to 56-31. Although the number of signal processing sections 56 is 32, it is illustrative and not restrictive and may be 8, 16, or 64.

Figure 7:
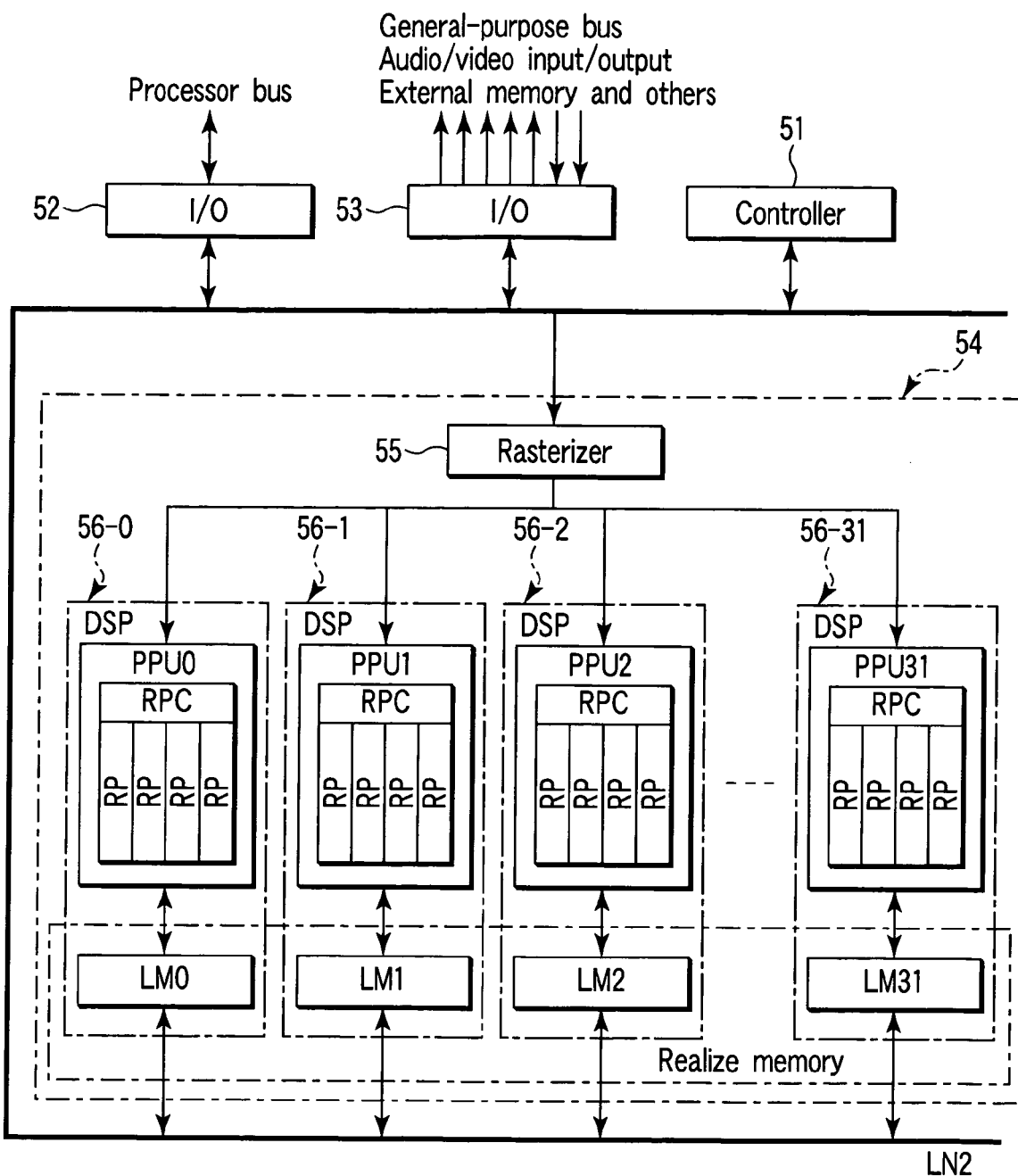
FIG. 7 is a block diagram to help explain a detailed configuration of the graphic processor in the circuit of FIG. 6.

A detailed configuration of the graphic processor 50 in the circuit of FIG. 6 will be explained by reference to FIG. 7. The computing section 54 includes the rasterizer 55 and 32 signal processing sections 56-0 to 56-31. The rasterizer 55 generates a pixel according to the inputted image information. A pixel is the smallest unit area handled in drawing a specific figure. A figure is represented by a set of pixels. The generated pixels are determined by the shape of a figure (the positions occupied by the figure). That is, when a certain position is drawn, a pixel corresponding to the position is generated. When another position is drawn, another pixel corresponding to the position is generated. The signal processing sections 56-0 to 56-31 include pixel processing sections PPU0 to PPU31 and local memories LM0 to LM31, respectively. The local memories LM0 to LM31 are provided for the pixel processing sections PPU0 to PPU31 in a one-to-one correspondence.

Each of the pixel processing sections PPU0 to PPU31 has four realize pipes RP. Four realize pipes RP constitute one PR cluster PRC (realize pipe cluster). Each of the PR clusters PRC performs a SIMD (Single Instruction Multiple Data) operation, thereby processing four pixels at the same time. The pixels corresponding to the respective positions of the figure are allocated to the pixel processing sections PPU0 to PPU31. According to the positions occupied by the figure, the corresponding pixel processing sections PPU0 to PPU31 process the pixels.

The local memories LM0 to LM31 store the pixel data generated by the pixel processing sections PPU0 to PPU31, respectively. The local memories LM0 to MM31 constitute a realize memory as a whole. The realize memory is, for example, a DRAM. In the DRAM, the individual memory areas having a specific data width correspond to the local memories LM0 to LM31.

In the image drawing processor system LSI configured as described above, when the method of designing a semiconductor integrated circuit device according to the first or second embodiment is applied to the analog circuits, SRAM, and logic circuit, excluding the memories, such as the main processor 21, controller 51, or rasterizer 55, the pattern occupied area of these circuit sections can be reduced, which realizes higher integration.

As described above, according to the first and second embodiments, instead of applying the well potential fixing potential to all of the standard cells (or each of the standard cells), the well potential is fixed by using spacer cells or filler cells to fill up spacings (gaps) after the standard cells are arranged. Therefore, the area of the standard cells can be reduced or the sizes of the transistors in a standard cell is made larger to increase the driving capability without permitting the substrate potential to change to such an extent that the transistor performance is impaired. As a result, a higher integration or higher performance of the semiconductor integrated circuit device can be realized.

The well potential fixing active regions (P-sub region and N-sub region) are formed only in the spacer cells or filler cells, which enables the pattern occupied area to be minimized. In addition, 2-terminal cells are selectively used in a part of the circuit designed using 4-terminal cells, which enables the optimization of the operation timing.

The result depends on which of the pattern occupied area or the operation speed is given priority in design. The inventors have verified in simulations that, when the reduction of the pattern occupied area was given the highest priority, an approx. 10% reduction in the area of the relevant circuit section could be expected.

As described above, the semiconductor integrated circuit device with the lowered power supplied voltage and its design method are realized which are capable of fixing the well potential effectively, while suppressing an increase in the pattern occupied area and a drop in the driving capability of the semiconductor elements formed inside.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
a circuit section which is formed by arranging cell columns, each having standard cells arranged in a first direction, in a second direction crossing the first direction, the cell columns including,
first standard cells each of which has a first and a second terminal to which a power supply voltage and the ground potential are applied, a third and a fourth terminal to which a well potential fixing potential is applied, and a transistor circuit to which the first and second terminals supply power and the third and fourth terminals apply a back gate bias, and
second standard cells which fill up empty regions in the cell columns and apply the well potential fixing potential to the third and fourth terminals of the first standard cells, the second standard cells being spacer cells or filler cells, each of the spacer cells or filler cells having a first and a second power supply line provided at two sides facing each other and extending in the first direction, a first well region of a first-conductivity type formed in a semiconductor substrate under the first power supply line, a second well region of a second-conductivity type formed in the semiconductor substrate under the second power supply line, a first sub-region of the first-conductivity type formed in the first well region, and a second sub-region of the second-conductivity type formed in the second well region and includes no logic circuit.

2. The semiconductor integrated circuit device according to claim 1, wherein each of the first standard cells has a third and a fourth power supply line which are provided at two sides facing each other and extending in the first direction and which function as the first and second terminals, a third well region of a first-conductivity type formed in the semiconductor substrate under the first power supply line, and a fourth well region of a second-conductivity type formed in the semiconductor substrate under the second power supply line.

3. The semiconductor integrated circuit device according to claim 2, wherein each of the transistor circuits has a first MOS transistor of the second-conductivity type which is formed in the third well region and whose source is connected to the third power supply line and to whose back gate a back gate bias is applied from the third terminal and a second MOS transistor of the first-conductivity type which is formed in the fourth well region and whose source is connected to the fourth power supply line and to whose back gate a back gate bias is applied from the fourth terminal.

4. The semiconductor integrated circuit device according to claim 3, wherein the third power supply line has a first branch section formed in the second direction and connected to the first MOS transistor, the fourth power supply line has a second branch section formed in the second direction and connected to the second MOS transistor, with the first and second branch sections being extended so as to face each other.

5. The semiconductor integrated circuit device according to claim 4, wherein the gates of the first and second MOS transistors are arranged in the second direction.

6. The semiconductor integrated circuit device according to claim 1, wherein the first power supply line has a third branch section formed in the second direction and connected to the first sub-region, the second power supply line has a fourth branch section formed in the second direction and connected to the second sub-region, with the third and fourth branch sections being extended so as to face each other.

7. The semiconductor integrated circuit device according to claim 6, wherein the first and third power supply lines in the first and second standard cells in the cell columns are connected in common, the second and fourth power supply lines in the first and second standard cells in the cell columns are connected in common, the first and third well regions in the first and second standard cells in the cell columns are connected in common, the second and fourth well regions in the first and second standard cells in the cell columns are connected in common, the potential of the first power supply line applied to the first sub-region in the second standard cell is supplied to the third well region in the first standard cell to fix the well potential, and the potential of the second power supply line applied to the second sub-region in the second standard cell is supplied to the fourth well region in the first standard cell to fix the well potential.

8. The semiconductor integrated circuit device according to claim 7, wherein the first and second standard cells in the cell columns share the first and third power supply lines and the second and fourth power supply lines.

9. The semiconductor integrated circuit device according to claim 8, wherein adjacent cell columns share either the first and third power supply lines or the second and fourth power supply lines.

10. The semiconductor integrated circuit device according to claim 1, further comprising third standard cells each of which has a fifth and a sixth terminal to which the power supply voltage and ground potential are applied and a circuit to which the fifth and sixth terminals supply power.

11. The semiconductor integrated circuit device according to claim 10, wherein each of the third standard cells has a fifth and a sixth power supply line provided at two sides facing each other and extending in the first direction, a fifth well region of the first-conductivity type formed in the semiconductor substrate under the fifth power supply line, and a sixth well region of the second-conductivity type formed in the semiconductor substrate under the sixth power supply line.

12. The semiconductor integrated circuit device according to claim 11, wherein the fifth power supply line has a fifth branch section connected to the fifth well region in the third standard cell formed in the second direction, the sixth power supply line has a sixth branch section connected to the sixth well region in the third standard cell formed in the second direction, with the fifth and sixth branch sections being extended so as to face each other.

13. The semiconductor integrated circuit device according to claim 12, wherein the first to third standard cells in the cell columns share the first, third, and fifth power supply lines and the second, fourth, and sixth power supply lines.

14. The semiconductor integrated circuit device according to claim 13, wherein adjacent cell columns share either the first, third, and fifth power supply lines or the second, fourth, and sixth power supply lines.

* * * * *

UNITED STATES PATENT AND TRADEMARK OFFICE
CERTIFICATE OF CORRECTION

| | |
|---|---|
| PATENT NO. | : 7,368,767 B2 |
| APPLICATION NO. | : 11/087597 |
| DATED | : May 6, 2008 |
| INVENTOR(S) | : Kinoshita et al. |

Page 1 of 1

It is certified that error appears in the above-identified patent and that said Letters Patent is hereby corrected as shown below:

On the title page, Item (30), the Foreign Application Priority Data is incorrect. Item (30) should read:

-- (30) Foreign Application Priority Data

Dec. 17, 2004  (JP) ...............................................2004-366438 --

Signed and Sealed this

Fifth Day of August, 2008

JON W. DUDAS
*Director of the United States Patent and Trademark Office*